United States Patent [19]

Storti et al.

[11] Patent Number: 4,810,902
[45] Date of Patent: Mar. 7, 1989

[54] LOGIC INTERFACE CIRCUIT WITH HIGH STABILITY AND LOW REST CURRENT

[75] Inventors: Sandro Storti, Sesto S. Giovanni; Dominico Rossi, Cilavegna; Giuseppe Di Natale, Augusta, all of Italy

[73] Assignee: SGS Microelettronica S.p.A., Catania, Italy

[21] Appl. No.: 103,450

[22] Filed: Sep. 30, 1987

[30] Foreign Application Priority Data

Oct. 2, 1986 [IT] Italy .................. 83648 A/86

[51] Int. Cl.$^4$ ............. H03K 19/02; H03K 17/16; H03K 19/017; G05F 3/16
[52] U.S. Cl. ........................ 307/446; 307/443; 307/448; 307/475; 323/317
[58] Field of Search ................... 323/315–317; 307/443, 446, 448, 475

[56] References Cited

U.S. PATENT DOCUMENTS 4,656,374 4/1987 Rapp .................. 307/446

Primary Examiner—Stanley D. Miller
Assistant Examiner—M. R. Wambach
Attorney, Agent, or Firm—Bierman & Muserlian

[57] ABSTRACT

An improved logic interface circuit having both a low current drain under rest conditions and a great stability in respect of temperature variations, is based on an original and effective implementation of the so-called bandgap-type voltage reference circuit, according to which the intrinsic gain of the bandgap system is not utilized, as normally happens in such voltage reference circuits for providing a negative feedback capable of compensating the temperature coefficient of the $V_{be}$, but for obtaining, under open loop conditions, a transition of the output of the circuit when the input of the circuit crosses a certain threshold voltage.

5 Claims, 1 Drawing Sheet

LOGIC INTERFACE CIRCUIT WITH HIGH STABILITY AND LOW REST CURRENT

The present invention relates to an improved logic interface circuit with low current drain under rest conditions and with high stability characteristics in respect of temperature variations.

Generally, the invention is of particular utility in the field of semiconductor devices monolithically integrated on a single chip of semiconductor material, typically silicon, and more particularly in devices for switching type functions and for complex integrated systems.

In devices of this kind it is necessary or advantageous to reduce as much as possible the power dissipation when the circuit or sections of the integrated circuit are under rest conditions, that is when they are not momentarily utilized for effecting their logic functions. This is obtained by providing suitable interface circuits for as many logic inputs of the so-called "ENABLE" type belonging to more complex integrated circury. When such input are at their "0" state, the disactivate the relative integrated circuit thus minimizing power dissipation.

Figure 1:
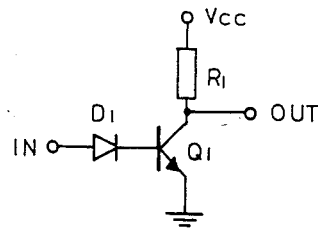
Figure 2:
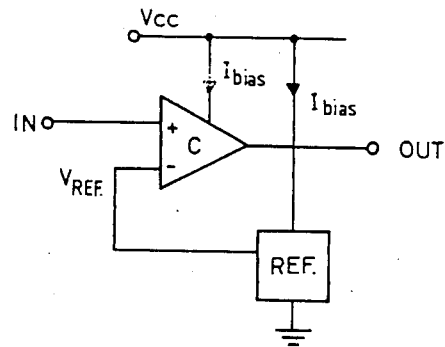

These logic interface circuits substantially are based on the threshold voltage of a diode or of a bipolar transistor or of a MOS transistor or of a combination thereof or such circuits are based on the "comparator/voltage reference" circuit. Annexed FIGS. 1 and 2 show, respectively, one logic interface circuit based on the threshold voltage of a diode ($D_1$) and another using a gain stage formed by the transistor $Q_1$ and a "comparator/voltage reference" circuit.

These known types of logic interface circuits do not provide an optimal option under all aspects.

In fact, a circuit of the first type (FIG. 1) shows a very low rest current (low power dissipation), but the logic threshold voltage is not stable being influenced by temperature. The threshold being based upon the $V_{be}$ (base-emitter voltage), which particularly for silicon is notably very sensitive to the temperature.

Conversely a circuit of the second type (FIG. 2), using a "comparator/voltage reference" system, is capable of ensuring a great stability of the value of the logic threshold voltage irrespectively of temperature variations, but the circuits of the comparator and of the voltage reference require bias currents also when the input and the output are both at the logic "0" state ("low" in terms of voltage).

The present invention provides an improved logic interface circuit combining the advantage of an extremely low current drain under rest conditions coupled with an exceptional stability of the threshold voltage in respect of temperature variations. The circuit of the instant invention is advantageously different from both types of known interface circuits described above though behaving, during operation, as a threshold circuit based on the turn-on threshold volage of a base-emitter junction as well as a threshold circuit of the "comparator/voltage reference" type, thus in practice compounding the advantages of both types of circuits without conversely suffering from the respective drawbacks and limitations.

Essentially, the interface circuit of the invention is based on an original and efficient implementation of the so-called bandgap type voltage reference circuit wherein the intrinsic gain of the system is no longer utilized, as it normally happens in such voltage reference circuit, for providing a negative feedback capable of maintaining a stable outoput voltage, but for obtaining, under open loop conditions, a transition of the output voltage when the input voltage goes through a certain threshold value.

The logic interface circuit in accordance with the present invention comprises:

an output bipolar transistor or equivalent ($T_3$) of a first type of polarity requiring a certain drive current for passing from a cut-off state to a ON state in a common emitter configuration;

an input stage comprising a pair of bipolar transistors ($T_1$ and $T_2$) of a second type of polarity, the bases of which are connected in common and to the input node of the input stage, the two bipolar transistors cooperating with a current mirror wherein the transconductance of the branch of said current mirror comprising the transistor $T_2$ is greater than the transconductance of the branch of the current mirror comprising the transistor $T_1$ and wherein the current densities through said transistors $T_1$ and $T_2$ are different one from the other;

the drive current for said output transistor being tapped from the greater transductance branch of said input stage and said output transistor being driven to a ON state when the voltage at the input node of the input stage equals a threshold value equivalent to the bandgap voltage of the semiconductor material with which said bipolar transistors are made.

Preferably the output transistor of said first type of polarity is a PNP bipolar transistor or a PNP equivalent transistor while the two bipolar transistors of the input stage are NPN transistors.

Figure 3:
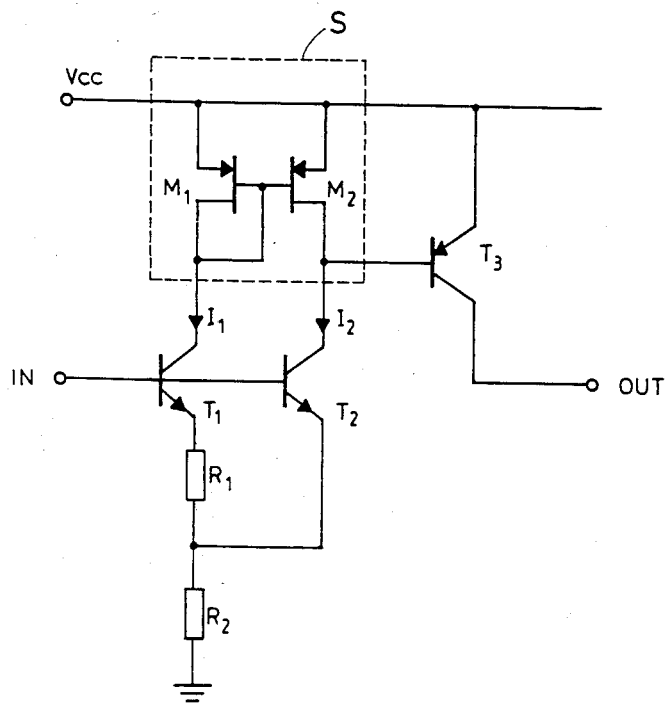

For a purely illustrative and nonlimitative purpose, an interface circuit in accordance with the present invention may be represented schematically by the circuit depicted in FIG. 3.

The circuit comprises essentially a bipolar PNP transistor or PNP equivalent transistor $T_3$, connected in a common emitter configuration and an input stage comprising the pair of bipolar NPN transistors $T_1$ and $T_2$, the bases of which are connected in common to an input node, and a current mirror (complexly indicated with the dash line square S). The branch of the input stage (i.e. of the current mirror) comprising the transistor $T_1$ comprises two resistances in series $R_1$ and $R_2$ connected between the emitter of $T_1$ and the common ground of the circuit, while the branch of the input stage comprising the transistor $T_2$ comprises only a resistance $R_2$ between the emitter of $T_2$ and said common ground.

In the embodiment depicted in FIG. 3, the current mirror S is made with two field effect transistors $M_1$ and $M_2$, which may be of the junction type (J-FET) or MOS-FET transistors. Naturally, any other type of current mirror, for example one made with bipolar transistors, with diodes and transistors, with resistors and an operational amplifier, etc., may be used satisfactorily in the circuit of the invention although it is preferable to maintain the circuit as simple as possible. In particular, the two field effect transistors $M_1$ and $M_2$ may be respectively substituted by two PNP transistors.

In every case, the input stage is such as to provide for a current density through the transistor $T_2$ larger than the current density through the transistor $T_1$.

This may be obtained conveniently by making the transistor $T_1$ with an emitter area greater than the emitter area of the transistor $T_2$, alternately the same effect may also be obtained by modifying the ratio of the current mirror (i.e. by making the transistors $M_1$ and $M_2$ of different sizes) or by intervening on both parameters at the same time.

To a greater difference of current density through the two bipolar transistors $T_1$ and $T_2$ corresponds to larger gain of the circuit but also a larger area requirement; for these reasons it is preferable that the ratio between transistors areas be kept between 6 and 12.

The operation of the circuit of the invention may be described as follows.

By fixing first a certain threshold value for the input voltage:

$$V_{in} = V^*_{in}$$

and imposing, for this threshold condition, $$I_1 = I_2 = I_0^* \qquad (1)$$

and if $\alpha = (T_1 \text{ emitter area}/T_2 \text{ emitter area})$ it follows that:

$$I_1 = \frac{V_{beT2} - V_{beT1}}{R_1} = \frac{\frac{KT}{q}\ln\alpha}{R_1} \qquad (2)$$

and $$V_{in} = (I_1 + I_2)R_2 V_{beT} \qquad (3)$$

by combining (1), (2) and (3)

$$V_{in}^* = 2\frac{R_2}{R_1} \frac{KT}{q} n\alpha + V_{beT1}$$

In the vicinity of the threshold (i.e. $V_{in} = V^*_{in}$), the transconductance of the branch of the input stage comprising the transistor $T_2$ is greater than that of the branch comprising the transistor $T_1$ ($T_1$ being in series only to $R_1$) infact:

$$\frac{1}{g_{mT1}} + R_1 > \frac{1}{g_{mT2}}$$

being $g_{mT} = g_{mT}$ because $I_1 = I_2$ it follows that:
 (1) for $V_{in} > V^*_{in}$ $I_2 > I_1$ $T_3 \rightarrow$ ON $I_{drained} = I_1 + I_2$
 (2) for $V_{in} < V^*_{in}$ $I_2 < I_1$ $T_3 \rightarrow$ OFF $I_{drained} = I_1 + I_2$
If one imposes:
 (a) $V^*_{in} = V_{bg}$ (bandgap voltage of silicon) a threshold voltage is obtained which is
 stable in respect of temperature;
 independent of the value of the supply voltages;
 of a conveniently intermediate value in respect of the normal requirements of such circuits ($V^*_{in} \approx 1250$ mV);
 (b) the current drain at the threshold condition (i.e. $V^*_{in} = V_{be}$), that is $I_{drained}$, is equal to $$I_1 + I_2 = \frac{V^*_{in} - V_{bgT2}}{R_2}.$$

As it will be clear to the expert technician, the circuit is easily optimizable in order to make the current drained at the threshold condition as low as possible. In respect of the more complex circuits of the prior technique capable of ensuring a comparable good stability in respect of temperature variations, the circuit of the instant invention needs a reduced number of components to be biased and consequently the current drained will be less than in the comparable circuits of the prior art.

(c) Below the value of the threshold voltage (i.e. when $V_{in} < V_{be}$ where $V_{be}$ is the forward voltage on the base-emitter junction of $T_1$, the transistors $T_1$, $T_2$ and $T_3$ are all cut-off and the current drain is substantially null and the output is in a low state.

Therefore also the requirement for a low current drain under rest conditions is perfectly satisfied by the circuit of the instant invention.

As it will be clear to the expert technician, the "threshold" under which the current drain at such rest conditions is null, remains temperature dependent (i.e. 400 mV $< V_{be} <$ 800 mV for 150° C. $>$ T $>$ $-50°$ C.), nevertheless, in practice the driving circuits normally ensure a maximum output voltage lower than 0.4 V for a "low" or "0" logic state, thus the interface circuit of the invention practically ensure a low current drain under all foreseeable temperature conditions, when the input node is in a "low" or "0" logic state.

What we claim is:

1. A logic interface circuit having a power supply rail and a common ground rail, an input terminal connectable to a source of logic signals and an output terminal for producing a replica of said logic signals, said circuit comprising a bipolar or a bipolar equivalent output transistor ($T_3$) of a first type of polarity, connected in common emitter configuration, having an emitter connected to one of said rails, a collector connected to said output terminal and a base connected to a source of a current signal for operatively driving the transistor to a condition state from a cut-off state and vice-versa a function of said logic signals, wherein said source of a current signal is an input stage which comprises a first ($T_1$) and a second ($T_2$) bipolar transistors of a second type of polarity having their respective bases connected in common to said input terminal; transistor ($T_1$) having an emitter connected to said common ground rail through a series of resistances ($R_1 + R_2$); transistor ($T_2$) having an emitter connected to said common ground rail through a series resistance ($R_2$); and a current mirror operatively connected to said power supply rail and having an input branch terminal connected to a drain of said first transistor ($T_1$) and an output branch terminal connected to a drain of said second transistor $T_2$ and to the base of said output transistor ($T_3$); wherein said transistor $T_2$ is operated at a greater current density than transistor ($T_1$); said output transistor ($T_3$) undergoing a transition from a cut-off state to a conduction stage and vice-verse whenever the signal applied to the input terminal crosses a threshold voltage ($V^*_{in}$) given by the following relation;

$$V_{in}^* = 2\frac{R_2}{R_1} \frac{KT}{q}\ln + V_{beT1}$$

where $\alpha$ is the ratio between the current density in said second transistor ($T_2$) and the current density in said first transistor ($T_1$),, $V_{beT1}$ is the base-emitter voltage drop of said first transistor ($T_1$).

2. The circuit according to claim 1, wherein said transistor $T_2$ is operated at a greater current density than transistor ($T_1$) by selecting a desired current ratio for said current mirror.

3. The circuit according to claim 1, wherein said transistor of a first type of polarity is a PNP or PNP equivalent transistor and said transistors of a second type of polarity are NPN transistors.

4. The circuit according to claim 1, wherein said transistors $T_1$ and $T_2$ have different areas.

5. The circuit according to claim 1, wherein said transistor $T_1$ has an area comprises between 1 and 12 times the areas of transistor $T_2$.

* * * * *